United States Patent
Kale

(10) Patent No.: US 12,181,191 B2
(45) Date of Patent: Dec. 31, 2024

(54) PRESSURE REGULATED SEMICONDUCTOR WAFER COOLING APPARATUS AND METHOD AND A PRESSURE REGULATING APPARATUS

(71) Applicant: Edwards Vacuum LLC, Sanborn, NY (US)

(72) Inventor: Kaustubh Kale, Chelmsford, MA (US)

(73) Assignee: Edwards Vacuum LLC, Sanborn, NY (US)

( * ) Notice: Subject to any disclaimer, the term of this patent is extended or adjusted under 35 U.S.C. 154(b) by 267 days.

(21) Appl. No.: 17/904,056

(22) PCT Filed: Feb. 10, 2021

(86) PCT No.: PCT/IB2021/051067
§ 371 (c)(1),
(2) Date: Aug. 11, 2022

(87) PCT Pub. No.: WO2021/161181
PCT Pub. Date: Aug. 19, 2021

(65) Prior Publication Data
US 2023/0112125 A1    Apr. 13, 2023

(30) Foreign Application Priority Data
Feb. 12, 2020    (GB) ..................... 2001894

(51) Int. Cl.
F25B 49/02    (2006.01)
F25B 41/20    (2021.01)
(Continued)

(52) U.S. Cl.
CPC .............. *F25B 49/02* (2013.01); *F25B 41/20* (2021.01); *F25B 41/40* (2021.01);
(Continued)

(58) Field of Classification Search
CPC ......... H01L 21/67103; H01L 21/67109; H01L 21/6715; H01L 21/67248; H01L 21/68714
See application file for complete search history.

(56) References Cited

U.S. PATENT DOCUMENTS

| | | | |
|---|---|---|---|
| 7,905,109 B2* | 3/2011 | Hwang | H01L 21/67109 62/304 |
| 2001/0016427 A1* | 8/2001 | Ueda | H01L 21/6715 438/780 |

(Continued)

OTHER PUBLICATIONS

PCT Notification of Transmittal of the International Search Report and the Written Opinion of the International Searching Authority, or the Declaration, PCT International Search Report and PCT Written Opinion dated May 10, 2021 for corresponding PCT application Serial No. PCT/IB2021/051067, 14 pages.
British Examination Report dated Aug. 4, 2020 and Search Report dated Aug. 3, 2020 for corresponding British application Serial No. GB2001894.1, 6 pages.

*Primary Examiner* — Henry T Crenshaw
(74) *Attorney, Agent, or Firm* — Theodore M. Magee; Westman, Champlin & Koehler, P.A.

(57) ABSTRACT

A semiconductor wafer cooling system and method and a pressure regulating apparatus for mitigating pressure increases in a semiconductor wafer conditioning circuit are disclosed. The pressure regulating apparatus comprises: a buffer vessel, the buffer vessel comprising an inlet and outlet channel; wherein the inlet channel is configured in operation to be in fluid communication with a higher pressure location of the semiconductor wafer conditioning circuit, and the outlet channel is configured in operation to be in fluid communication with a lower pressure location. the inlet channel comprises a pressure controlled valve configured to close the inlet channel during normal operation such that the buffer vessel is isolated from the higher pressure location of the conditioning circuit and to open the inlet channel in (Continued)

response to the pressure within the semiconductor conditioning circuit rising above a predetermined level.

25 Claims, 5 Drawing Sheets

(51) Int. Cl.
 *F25B 41/40* (2021.01)
 *H01L 21/67* (2006.01)
 *H01L 21/687* (2006.01)
(52) U.S. Cl.
 CPC .... *H01L 21/67103* (2013.01); *F25B 2500/07* (2013.01); *F25B 2600/2501* (2013.01); *F25B 2700/197* (2013.01); *H01L 21/68714* (2013.01)

(56) References Cited

U.S. PATENT DOCUMENTS

| | | | |
|---|---|---|---|
| 2002/0153100 A1* | 10/2002 | Hsiao | G05D 7/0635 |
| | | | 118/724 |
| 2005/0268938 A1* | 12/2005 | Johnson | F17C 9/02 |
| | | | 134/2 |
| 2009/0113912 A1* | 5/2009 | Kishimoto | F25B 9/002 |
| | | | 62/259.1 |
| 2009/0250202 A1* | 10/2009 | Eibl | H01L 21/67109 |
| | | | 165/200 |
| 2014/0004706 A1 | 1/2014 | Miya et al. | |
| 2018/0067395 A1* | 3/2018 | Zhou | B67D 7/78 |
| 2022/0034708 A1* | 2/2022 | Elliott | G01G 23/00 |

\* cited by examiner

PRESSURE REGULATED SEMICONDUCTOR WAFER COOLING APPARATUS AND METHOD AND A PRESSURE REGULATING APPARATUS

CROSS-REFERENCE TO RELATED APPLICATION

This application is a Section 371 National Stage Application of International Application No. PCT/162021/051067 filed Feb. 10, 2021, and published as WO 2021/161181 A1 on Aug. 19, 2021, the content of which is hereby incorporated by reference in its entirety and which claims priority of British Application No. 2001894.1, filed Feb. 12, 2020.

FIELD

The field of the invention relates to a pressure regulating apparatus for a semiconductor wafer conditioning circuit and a semiconductor wafer cooling system comprising such a pressure regulating apparatus.

BACKGROUND

With the ever-increasing demand for memory and processing power, there is an interest in the development of next generation semiconductor devices. These next generation devices require new fabrication processes that rely on ever tighter control of process variables and ever wider process variable envelopes in terms of temperature and pressure. For example, next generation semiconductor fabrication processes for 3D NAND and MRAM require that the semiconductor wafer be cooled to very low temperatures during certain process steps. While thermal management of the semiconductor wafer is not a new requirement, what has changed is the low temperatures to which the wafer needs to be cooled. For some next generation MRAM processes, the theoretical required wafer temperatures are as low as −210 C. For 3D NAND, the required wafer temperatures are in the −85 C to −150 C range. These low temperatures present a challenge for the management of the fluid pressure inside the conditioning circuit.

In conventional semiconductor wafer cooling solutions, the chuck is cooled using a secondary heat transfer fluid (coolant) which is cooled using the refrigeration unit (chiller). However, heat transfer fluids that can function at the low temperatures required for next generation device fabrication are not generally available. Furthermore, such low temperatures may substantially increase the viscosity of any such conditioning fluid causing the pressure in the conditioning circuit to rise correspondingly.

One way of addressing this is to use a refrigerant which is the working fluid inside the refrigeration system to directly cool the wafer chuck as opposed to using a secondary heat transfer fluid. In some cases this may be a single refrigerant while in others it may be a mixed refrigerant. A mixed refrigerant may be a blend of multiple constituents and is a liquid-vapor mixture able to utilize both the sensible and latent heats of the fluid to absorb heat from the semiconductor wafer. This approach however does result in the phase change of certain constituents of the mixed refrigerant within the conditioning circuit, resulting in an increase in overall specific volume of the refrigerant mixture and consequently the pressure inside the conditioning circuit.

Many semiconductor wafer chucks and the components associated with their conditioning circuits (piping, fittings etc.) are rated for fairly low maximum operating pressures. Typically, this value is in the 150-200 PSIG (pounds per square inch gauge) range. With the requirement for colder temperatures, there is a realization that the coolant pressure, be it secondary heat transfer coolant or mixed refrigerant might exceed the maximum operating pressure limitation of the semiconductor wafer conditioning circuit, which in turn might damage the system.

It would be desirable to be able to cool semiconductor wafers to lower temperatures during processing operations without damaging the wafer conditioning circuit.

The discussion above is merely provided for general background information and is not intended to be used as an aid in determining the scope of the claimed subject matter. The claimed subject matter is not limited to implementations that solve any or all disadvantages noted in the background.

SUMMARY

A first aspect provides a pressure regulating apparatus for mitigating pressure increases in a semiconductor wafer conditioning circuit, said pressure regulating apparatus comprising: a buffer vessel, said buffer vessel comprising an inlet and outlet channel; wherein said inlet channel is configured in operation to be in fluid communication with a higher pressure location of said semiconductor wafer conditioning circuit, and said outlet channel is configured in operation to be in fluid communication with a lower pressure location; said inlet channel comprising a pressure controlled valve configured to close said inlet channel during normal operation such that said buffer vessel is isolated from said higher pressure location of said conditioning circuit and to open said inlet channel in response to said pressure within said semiconductor conditioning circuit rising above a predetermined level.

The inventors of the present invention recognised that with the increasing demands of temperature and pressure in semiconductor wafer processing there is an increased danger of pressure spikes within the conditioning fluid used to cool the semiconductor wafer. This can be problematic in some systems where the conditioning circuit that provides the local cooling for the semiconductor wafer may not be rated for particularly high operating pressures. This renders them susceptible to damage if the conditioning fluid experiences significant pressure spikes and this can be particularly problematic if there is leakage of the conditioning fluid into the vacuum chamber used for processing the semiconductor wafer. In this regard, the conditioning circuit for cooling the wafer, generally comprises a plurality of channels arranged locally to the wafer to provide the required paths for the conditioning fluid. These channels are relatively narrow channels to provide an increased surface area to volume ratio. The wafer conditioning circuit is generally within the process vacuum chamber and thus it is important that rises in pressure do not cause damage to the circuit such that it may leak conditioning fluid into the vacuum chamber.

It is therefore important that the conditioning circuit for cooling and in some cases warming the semiconductor wafer is protected from increases in pressure. With this in mind, the inventors have sought to provide a pressure regulating apparatus that can be added to a wafer cooling apparatus and which provides a pressure buffer or expansion vessel. This buffer vessel has an inlet channel that is configured to connect with a higher pressure channel within the cooling apparatus and comprises a pressure controlled valve which is closed during normal operation so that the buffer vessel is isolated from the semiconductor conditioning circuit but which, were the pressure to rise above a predetermined level, would open allowing conditioning fluid to flow through the inlet channel and into the buffer vessel thereby providing almost immediate pressure relief for the conditioning circuit and protecting it from the higher pressures. The buffer vessel also comprises an outlet channel which is connected to a lower pressure location of the semiconductor wafer conditioning circuit and through which the fluid in the buffer vessel is able to drain. In this regard, the higher pressure location is upstream of the lower pressure location.

In some embodiments, the pressure regulating system further comprises a check valve in said outlet channel for inhibiting flow from said conditioning circuit to said buffer vessel via said outlet channel.

In some cases, it may be advantageous to isolate the outlet channel from the conditioning circuit during normal operation and this may be done with a check valve such that were the pressure towards the outlet channel in the conditioning circuit to rise this would not raise the pressure in the buffer vessel.

In some embodiments, said pressure controlled valve comprises a mechanical valve, in some embodiments a mechanical spring loaded valve.

Although the pressure controlled valve may have a number of forms, it may be advantageous to use a non-powered mechanical valve such as a spring loaded valve as this will open in response to an increased pressure even if power is lost to the system. This may be advantageous and provide some protection from power failures.

In some embodiments, the pressure regulating system further comprises at least one pressure sensor for sensing a pressure of said conditioning fluid and control circuitry configured to generate control signals in response to signals received from said at least one pressure sensor.

As noted above, the pressure regulating system seeks to mitigate pressure rises occurring within the conditioning circuit and thus, it may be advantageous to have one or more pressure sensors to measure the pressure within the conditioning circuit. In this regard, the pressure sensors may sense the pressure in conditioning fluid channels connected to the conditioning circuit, the pressure measured there being indicative of the pressure within the conditioning circuit itself. Control circuitry may be associated with these pressure sensors and operable to generate control signals for controlling the system in response to signals received from these pressure sensors, in particular in response to signals received that indicate unexpected or unduly large rises in pressure.

In some embodiments, said pressure controlled valve comprises a power actuated valve, said control circuitry being configured to generate a control signal to open said power actuated valve in response to said at least one pressure sensor indicating a predetermined pressure level has been reached or exceeded.

Although the pressure controlled valve may be a mechanical valve, it may alternatively and/or additionally be a power actuated valve which can be controlled by the control circuitry in response to signals from the pressure sensors.

In some embodiments, said pressure regulating apparatus is configurable such that said predetermined pressure at which said pressure controlled valve opens can be selected.

One particular advantage of the pressure regulating system of embodiments is that it can be configured to mitigate against different increases in pressure, making a single system suitable for different applications and for protecting different conditioning circuits. In this regard, the protection of the system arises when the pressure controlled valve opens and thus, provided that the pressure controlled valve is configurable either by for example, changing the spring loading of a spring loaded valve or by selecting different values within the control circuitry in a power actuated system, then the system can be adapted to provide pressure relief at different pressure levels making it suitable for protecting different conditioning circuits which are rated for different operational pressures. Given that this system is a stand-alone pressure regulating system that can be added to an existing cooling system by mounting it between the refrigeration system and the conditioning circuit, having a configurable system allows it to be mounted within different refrigeration systems and protect different conditioning circuits. It also allows it to be adapted were processes to change, or safety pressure limits to be altered.

In some embodiments, said inlet channel further comprises a second valve, said second valve comprising a power actuated valve configured to be closed to isolate said pressure controlled valve and buffer vessel from said conditioning circuit when not powered and open when powered. The power actuated valve is controllable and can be closed when powered in response to a control signal.

In some embodiments, it may be advantageous to provide a second valve on the inlet channel which will close when not powered. It may be important to isolate the buffer vessel in certain circumstances and this may particularly be the case where the pressure actuated valve is a mechanical spring loaded valve whose components may be sensitive to higher temperatures and thus, during defrost or bake out mode where there can be a very high temperature refrigerant of the order of 125° C. in the conditioning circuit it may be advantageous to be able isolate the pressure controlled valve by controlling a power actuated valve.

In some embodiments, said buffer vessel comprises at least one further inlet channel in fluid communication with a higher pressure location than a location said outlet channel is in fluid communication with, said at least one further inlet channel comprising a power actuated valve said power actuated valve being normally closed when powered and open when not powered. The power actuated valve is controllable and can be open when powered in response to a control signal.

In some embodiments, it may be advantageous to provide an additional inlet channel to the buffer vessel. This can be used not only to increase the flow to the buffer vessel in cases of a pressure spike but also as a failsafe inlet channel were power to be lost to the device. In this device, as noted previously, a mechanically actuated pressure valve allows operation without power, however, in some embodiments it may be protected from higher temperature conditioning fluid by a power actuated valve which when not powered is closed. This renders the mechanical valve non-operational when power is lost. However, if a further inlet channel with a power actuated valve which is closed when powered during normal operation but opens when not powered is provided this allows the buffer vessel to provide pressure mitigation when power is lost even if the mechanically actuated valve is isolated from the conditioning fluid line at this point.

In some embodiments, said control signal circuitry is configured to generate a control signal to open said power actuated valve in said at least one further inlet channel in response to said at least one pressure sensor indicating a predetermined pressure level has been reached.

In addition to providing a pressure relief channel for when power is lost, the power actuated valve may also be controlled by the control circuitry to open in response to pressure rises and in this way provide an additional channel and improve the fluid flow to the buffer vessel thereby providing a system which provides a quicker response to rises in pressure.

In some embodiments, the at least one further inlet channel further comprises a check valve for inhibiting flow from said conditioning circuit to said buffer vessel via said at least one further inlet line.

The further inlet channel may have a check valve such that reverse flow from the buffer vessel is inhibited. This may be important where there is a pressure spike when power has been lost and the power actuated valve in the second line is open. If the pressure in the buffer vessel rises to quite a high level and then the pressure in the conditioning circuit begins to drop it is advantageous if there is no back flow of the high pressure conditioning fluid into the inlet line and thus, a check valve may be advantageous.

In some embodiments, said pressure regulating apparatus comprises an inlet line for receiving conditioning fluid from a refrigeration system and for supplying said conditioning fluid to said wafer conditioning circuit and a return line for receiving conditioning fluid from said wafer conditioning circuit and returning said fluid to said refrigeration system, said inlet channel being connected to said inlet line.

The pressure regulating apparatus is configured such that it may form an independent module that can be inserted between the refrigeration system which may be in the basement or sub fab of a semiconductor fab and the wafer conditioning circuit which is within the processing chamber in the fab itself. In such an arrangement the outlet line from the refrigeration system is connected to an inlet line of the pressure regulating apparatus which then flows to the conditioning circuit for cooling the wafer the pressure regulating apparatus having a return line that receives conditioning fluid from the wafer conditioning circuit and returns it to the refrigeration system for cooling again. The inlet line will be the higher pressure line and the outlet line the lower pressure line. The inlet channel on the buffer vessel may be connected to the inlet line and in some embodiments, said outlet channel is connected to said return line.

The outlet channel is connected to a lower pressure location which advantageously is the return line after the semiconductor conditioning circuit. This allows the buffer vessel to be effectively drained if the pressure in this line is significantly lower than the pressure in the inlet line supplying the conditioning fluid to the semiconductor conditioning circuit which has smaller channels to encourage heat transfer and thus, there is a considerable pressure drop across this circuit. In effect the inlet channel, buffer vessel and outlet channel provide a conditioning fluid bypass route when the pressure controlled valve is open allowing the conditioning fluid to bypass the wafer conditioning circuit and thereby protecting the wafer conditioning circuit from higher pressure conditioning fluid.

It should be noted, that the at least one further inlet channel is generally connected to the inlet line of the pressure regulating apparatus. However, in some cases it may be connected to the outlet line upstream of the point that the outlet channel of the buffer vessel is connected to.

In some embodiments, said pressure regulating apparatus comprises power actuated valves on said inlet and return lines for isolating said pressure regulating apparatus and wafer conditioning circuit from said refrigeration system, said system inlet and outlet power actuated valves being open when powered and closed when not powered.

For a further protection of the semiconductor conditioning circuit it may be advantageous to have system inlet and outlet valves that are power actuated and which enable the pressure regulating system and indeed the semiconductor wafer conditioning circuit to be isolated from the refrigeration system. In particular, these are powered valves which are configured to close when not powered such that if there is a power failure the semiconductor wafer conditioning circuit is automatically isolated from the refrigeration system. It should be noted that a power failure will cause the whole semiconductor process to shut down and thus, isolating the system from refrigerant serves to protect the semiconductor circuit from pressure rises that may occur in this circumstance.

In some embodiments, said control circuitry is configured in response to said sensed pressure rising above a further predetermined level that is higher than said predetermined level to close said system inlet valve.

As well as isolating the system when there is a power loss, embodiments may isolate the system in response to pressure rises above a further predetermined level. In this regard, rises above a first predetermined level is mitigated using valves that provide access to the buffer vessel. If however the pressure continues to rise to above a further level then it may be advantageous to isolate the pressure regulating apparatus and conditioning circuit from the refrigeration system at least temporarily and thus, the system inlet valve may be configured to close in response to a particular pressure increase.

In some embodiments, said control circuitry is configured in response to said sensed pressure rising to a further higher predetermined level to close said system outlet valve.

If the pressure does not fall on closing the system inlet valve then the system outlet valve may be closed too and the whole system may be shut down.

In some embodiments, the system may in any case choose to shut the outlet valve a predetermined time after shutting the inlet valve. The predetermined time allows at least some conditioning fluid to drain from the system into the refrigeration system prior to shutting the outlet valve.

In some embodiments, said control circuitry is configured in response to said sensed pressure falling to open said system inlet valve.

It may be that following closure of the inlet valve the pressure starts to fall within the conditioning circuit and where this is the case it may be that the control circuitry opens the inlet valve again and the system continues to operate.

Although, the conditioning fluid may comprise a single phrase fluid, in some embodiments, said conditioning fluid comprises a 2-phase mixture of fluids This pressure regulating system can provide pressure regulation for different conditioning fluids but it is particular effective for a two-phase conditioning fluid which in many cases may be the refrigerant from the refrigeration system which may be a mixed refrigerant system. Such a mixed phase refrigerant is particularly effective at providing the low temperatures that are increasingly required in semiconductor processing. However, the presence of gas and liquid phases in equilibrium does mean that changes in pressure are more prevalent as the liquid evaporates and forms a gas when warmed increasing the pressure within the system. Thus, these mixed phase or two-phase systems are particularly prone to pressure spikes and pressure regulating apparatus of embodiments are particularly effective at protecting semiconductor wafer conditioning circuits cooled by such systems.

The buffer vessel is an expansion vessel in some embodiments in the form of a tank that has a volume for mitigating pressure rises within the conditioning circuit. In some embodiments, a size of said buffer vessel is sufficient to accommodate expansion of said conditioning fluid within said apparatus warming from a low temperature of operation to room temperature.

As noted previously, the buffer vessel may protect the system during operation from pressure rises which may occur for example when liquid refrigerant in a mixed phase system evaporates. The apparatus may also be effective at protecting the system if there is a power failure. In order to effectively protect the system in case of a power failure the buffer vessel should be sized such that it can accommodate the expansion volume that the conditioning fluid will expand into when going from a coldest operational temperature of the wafer conditioning circuit to room temperature.

In some embodiments, said conditioning circuit comprises a plurality of conditioning circuits arranged in parallel for cooling a plurality of semiconductor wafers.

Embodiments are effective at not only protecting a single conditioning circuit but can be used if suitably sized for cooling a plurality of conditioning circuits arranged in parallel or independently of each other.

In some embodiments, said at least one pressure sensor comprises a plurality of pressure sensors configured to sense pressure within said plurality of conditioning circuits.

Where the pressure regulating apparatus is protecting a plurality of semiconductor circuits, it may be advantageous to have a plurality of pressure sensors for sensing the pressure in each of the conditioning circuits such that a pressure controlled valve can be open and pressure relief provided by the buffer vessel in response to a pressure rise in any of the circuits. In this regard, the individual wafers may experience different pressure conditions and thus, pressure spikes or rises may occur at different times in different circuits.

In some embodiments, said pressure regulating apparatus comprising a heating mechanism for warming said buffer vessel, said control circuitry being configured to control said heating mechanism to warm said buffer vessel in response to at least one of: activation of said pressure controlled valve occurring more frequently than a predetermined frequency; and a temperature of said buffer vessel falling below a predetermined level and staying below said predetermined temperature for a predetermined time.

Where the pressure regulating apparatus is activated often in a short period of time, especially in a mode where the set-point temperature of the refrigerant mixture is low, a condition may arise where liquid refrigerant is accumulated in the buffer volume. While some accumulation is fine and expected, if excess refrigerant is accumulated it is preferable to have a means to evaporate the liquid and return the refrigerant back to the cooling system for stable operations.

A second aspect provides a semiconductor wafer cooling apparatus comprising a refrigeration system and a pressure regulating apparatus according to a first aspect.

In some embodiments, said conditioning fluid comprises the refrigerant of said refrigeration system.

Although the conditioning fluid may be a secondary conditioning fluid that is cooled using heat exchangers in the refrigeration system, in some cases it may be the refrigerant itself that flows through the semiconductor conditioning circuit. In the latter case, this may be a mixed refrigerant and thus, pressure spikes are more prevalent and providing a pressure regulating apparatus is particularly important.

A third aspect provides, a method of providing pressure protection to a semiconductor wafer conditioning circuit, said method comprising: connecting an inlet channel and outlet channel of a pressure regulating apparatus according to a first aspect of the present invention to an inlet and outlet side of a semiconductor wafer conditioning circuit connected to a refrigeration system.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

The summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

Embodiments of the present invention will now be described further, with reference to the accompanying drawings, in which.

DETAILED DESCRIPTION

Before discussing the embodiments in any more detail, first an overview will be provided.

Embodiments provide a mechanism that allows for the regulation of pressure inside the channels (and associated fluid circuit) of an apparatus for conditioning a semiconductor wafer in some embodiments a semiconductor wafer chuck. A buffer expansion volume is provided along with an alternate flow path for the conditioning fluid (liquid, gas or mixture) in case the conditioning fluid's pressure rises above a predetermined operating pressure limit that is deemed to be a safe pressure limit and a means is provided to divert the conditioning fluid to the expansion volume.

In the event of a pressure rise, the coolant or conditioning fluid is diverted to the buffer volume by the means of one or more valves that actuate based on fluid pressure. In some embodiments, at least one of the valves is mechanically actuated such that the mechanism will function even in the event of a power failure. Once normal operating conditions are restored, the mechanism allows for the coolant to be introduced back into the conditioning circuit for continued operation.

Embodiments provide a buffer/added volume for the conditioning fluid which may be a secondary coolant or a mixed refrigerant fluid, dynamically as and when required, to help reduce pressure inside the conditioning circuit. As a basic thermodynamic principle, for a given mass of fluid, pressure is inversely proportional to volume. Therefore, increasing the volume available for expansion for a given mass of fluid results in a corresponding decrease in the pressure of the fluid. In a closed system (no new mass is added or removed from the system) it is important however that access to the buffer volume is controlled to ensure that the buffer volume does not become a part of the overall system volume during normal course of operation. The buffer volume should only come into play in the event of a pressure spike above a predetermined value. This is arranged by the means of control valves that react to fluid pressure.

Figure 1:
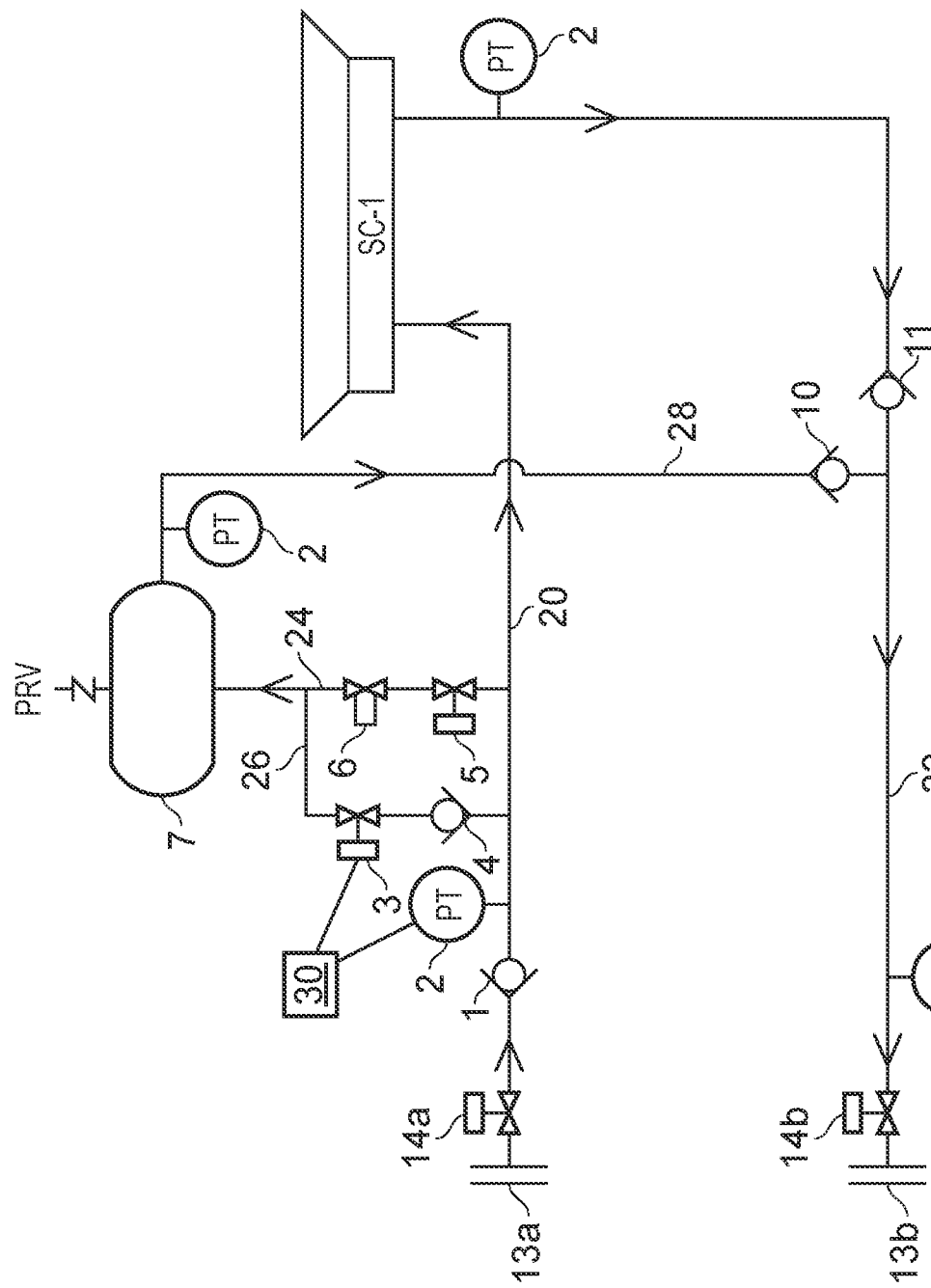
FIG. 1 schematically shows a pressure regulating apparatus according to a first embodiment.

FIG. 1 shows a pressure regulating apparatus connected to a conditioning circuit according to an embodiment. The pressure regulating apparatus is connected to a refrigeration system by a system inlet 14a and a system outlet 14b valve. These inlet and outlet valves are power operated and are configured such that they are open when powered but close when power is lost. System inlet valve 14a is connected to inlet line 20 that supplies conditioning fluid to the wafer conditioning circuit SC-1. Return line 22 takes conditioning fluid from the conditioning circuit SC-1 and returns it to the refrigeration system via outlet valve 14b.

The flow control system inlet and outlet valves 14a and 14b may be pneumatically or solenoid operated. 13a and 13b show where the system is connected to the refrigeration part of the cooling apparatus. In this embodiment, there are check valves 1 and 11 on the inlet and outlet lines to inhibit the back flow of conditioning fluids either back towards the refrigeration system along the inlet line 20 or back towards the conditioning circuit on the return line 22.

In this embodiment, there are a plurality of pressure sensors or pressure transducers 2 that are located at different points within the pressure regulation apparatus and which serve to sense the pressure of the conditioning fluid within this system which in turn relates to the pressure of the fluid within the conditioning circuit SC-1. The location and number of pressure transducers will depend on the system.

In this embodiment, there are two inlet channels 24 and 26 that connect inlet line 20 to a buffer volume 7. This buffer volume provides the pressure relief for the cooling system and is connected to inlet line 20 by a pressure controlled valve.

In this embodiment in one inlet line 24 there is a pressure controlled valve 6 which in this embodiment is a mechanical spring actuated valve which is configured to open in response to a predetermined pressure at its inlet and in this embodiment there is also a valve 5 which acts as an isolation valve and is a power actuated open type of valve which will be closed when there is no power to it but is open when powered. Thus, during normal operation, it will be open and allow fluid to pass through it such that valve 6 will open in response to rises in pressure and provide pressure relief to the conditioning circuit SC-1.

Although, in embodiments valve 5 is not present it may be advantageous to have such a valve as during pump maintenance it can be used to isolate the buffer volume and/or valve 6 from the rest of the system. Furthermore, valve 5 can be used to protect valve 6 during a bake out or defrost mode where there can be high temperature refrigerant at about 125° C. flowing through the tubing. As valve 6 is generally designed for cryogenic temperatures the polymer seals inside it may not be rated for high temperatures such that it may be advantageous to be able to protect it from these high temperature fluids by closing valve 5.

In this embodiment buffer vessel 7 has a PRV which is a safety valve configured to open in response to the buffer volume's pressure increasing above a predetermined safety limit. The pressure relief valve is configured to vent via a line such that the vented gas is delivered outside of the clean room environment.

In this embodiment, in addition to the first inlet channel 24 there is an additional inlet channel 26 providing a passage from the inlet line 20 to buffer volume 7. The second inlet channel comprises a power actuated valve 3 and a check valve 4 for resisting back flow of conditioning fluid from the buffer volume 7 to the inlet line 20. Power actuated valve 3 is a normally open type of valve that is it will be open when there is no power to it but is generally closed when powered. Thus, if there is a total power loss it will be de-energised and open and allow fluid into the buffer volume and thus, provide pressure protection for the system in the result of a power failure. In this embodiment, valve 3 is connected to system controller 30 which receives signals from the various pressure transducers 2 and which provides control signals to one or more of the control valves. System controller 30 is configured to open power actuated valve 3 in response to detecting a pressure rise above a predetermined level. In this way, pressure relief in the event of a pressure spike can be provided via two inlet channels 24 and 26 which improves fluid flow and provides faster mitigation of the pressure spikes.

In this embodiment, there is an outlet line 28 from buffer volume 7 to the return line 22. This acts to drain the excess pressure from buffer volume 7 and in effect provides a bypass path for the conditioning fluid bypassing semiconductor conditioning circuit SC-1 in the event of a pressure increase and providing pressure relief to the system. In some embodiments, outlet channel 28 has a check valve 10 for impeding back flow of conditioning fluid to the buffer volume 7 from the return line 22.

It should be noted that although a single semiconductor wafer conditioning circuit and a single pressure regulating apparatus are shown in FIG. 1, in some embodiments, there may be a plurality of semiconductor wafer conditioning circuits arranged in series, and in such a case the pressure regulating apparatus may serve to mitigate against pressure rises in all of them and/or there may be a plurality of pressure regulating apparatus with their inlets and outlets arranged in series between the refrigeration system and the conditioning circuits to provide increased pressure relief and/or an increased size buffer vessel 7 with a plurality of inlet channels.

Figure 2:
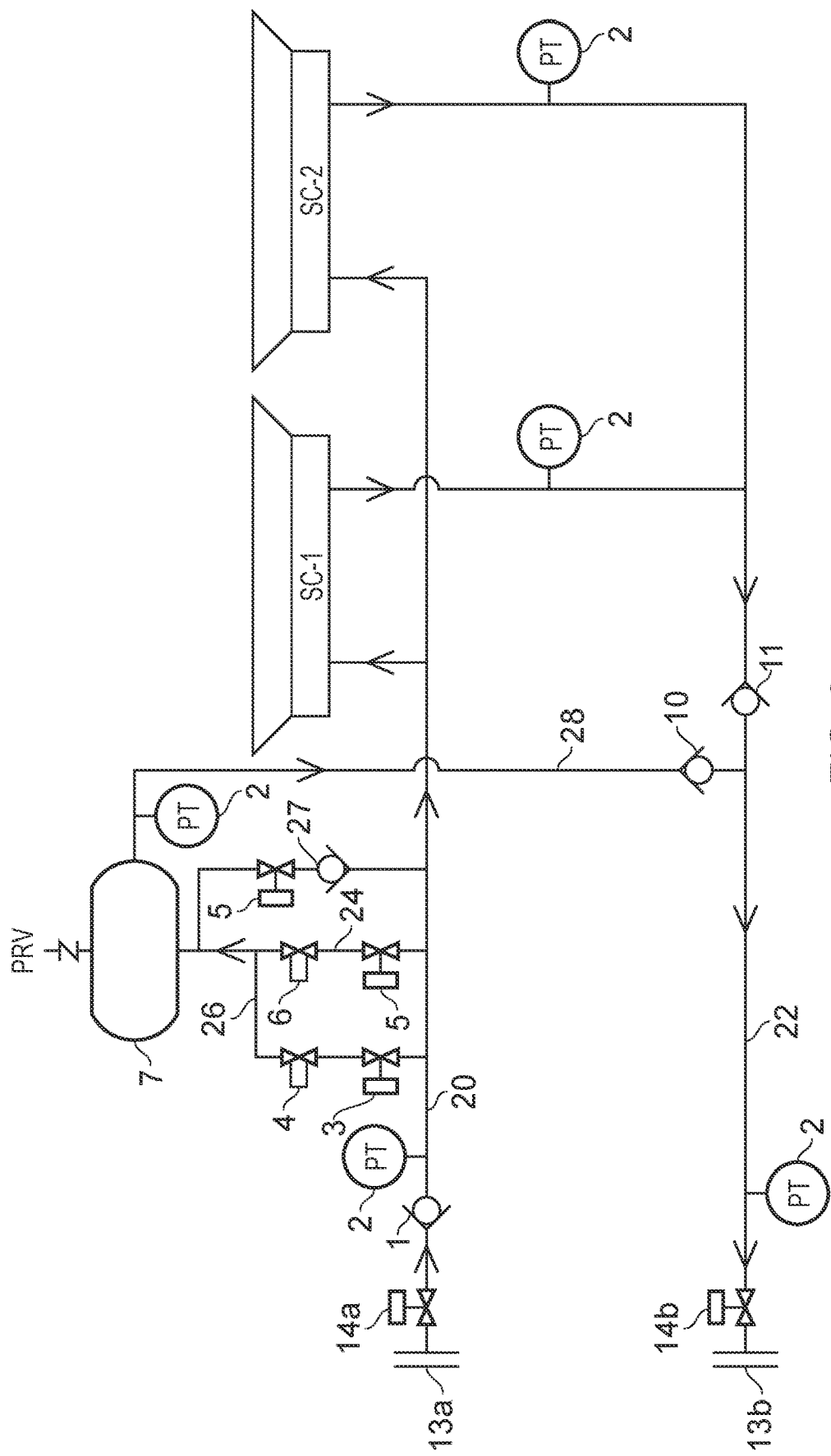
FIG. 2 schematically shows a pressure regulating apparatus according to a second embodiment.

FIG. 2 shows an alternative embodiment that is similar to FIG. 1 but is operable to provide pressure protection for multiple semiconductor conditioning circuits SC-1 and SC-2 arranged in parallel. Additionally, this embodiment comprises an additional inlet channel 27 to buffer volume 7 and this is in order to provide additional fluid flow paths to increase fluid flow into the buffer volume in response to a pressure spike. Additional fluid flow may be required as there are a plurality of wafer conditioning circuits each of which may experience a pressure spike at the same time and thus, greater pressure relief may be required.

Figure 3:
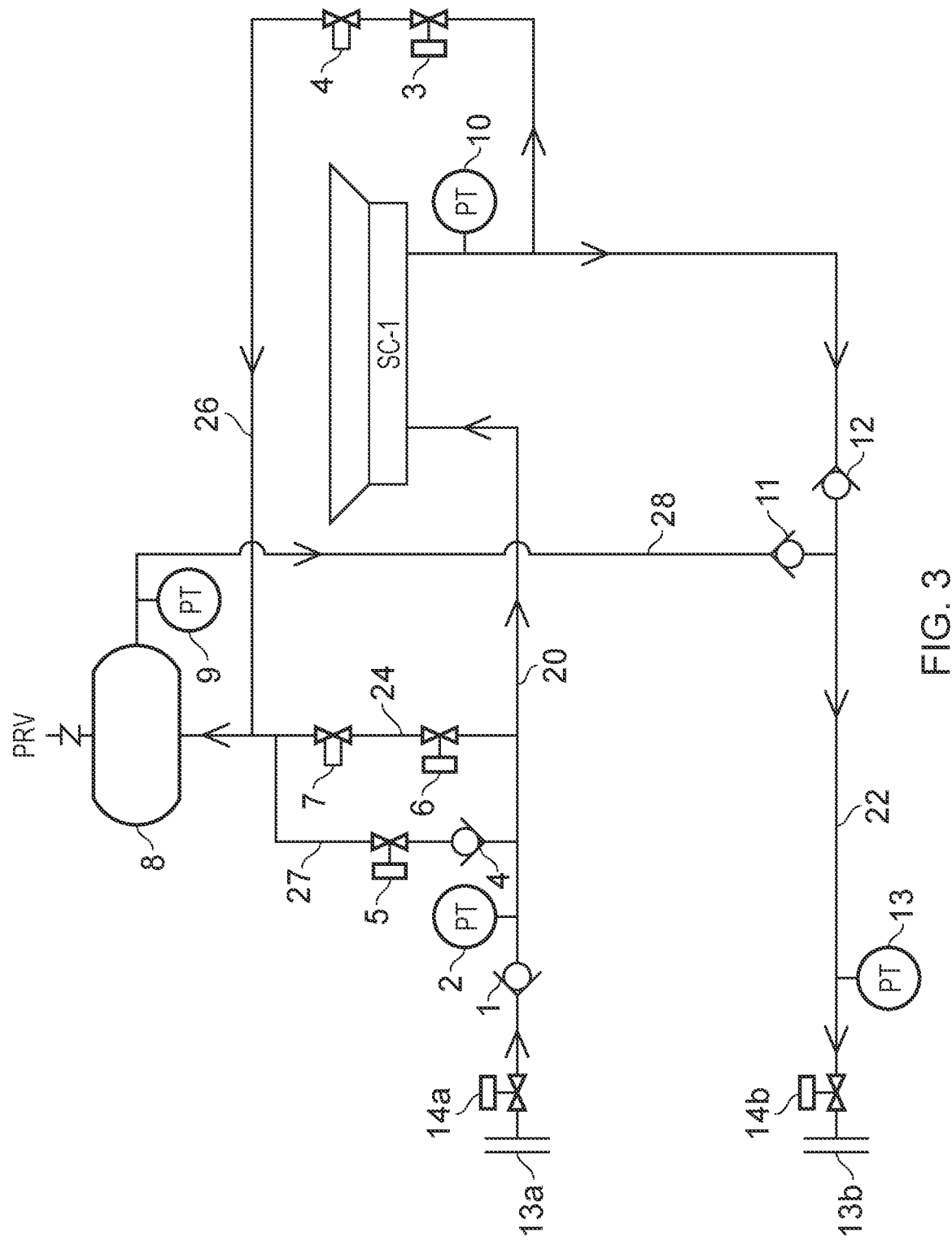
FIG. 3 schematically shows a pressure regulating apparatus according to a third embodiment.

FIG. 3 shows a further alternative embodiment where one of the inlet channels 26 that provides access to the buffer volume 7 and that helps regulate the pressure inside the wafer conditioning circuit may be connect with the conditioning fluid outlet line 22 downstream of the conditioning circuit although upstream of the connection of the outlet line 22 and outlet channel 28. This arrangement also provides effective pressure regulation and may be favourable where the physical arrangement and layout and piping of the conditioning circuit allows for additional room on this side. In this case, it should be noted that although, it is on the return line 22 that one of the inlet channels is provided, the outlet channel 28 is downstream of this inlet channel.

The portion below outlines the different modes of operation of embodiments of the pressure regulating apparatus.

In normal steady state operating mode: the conditioning fluid/mixed refrigerant (called 'fluid' hereafter) enters the pressure regulating apparatus at 13a on its way to the conditioning circuit directly connected to the chuck. The fluid flows through the semiconductor chuck SC-1 and exits this part of the circuit via connection 13b. The flow path of the fluid is 13a-14a-1-SC-1-11-13b.

The pressure regulating apparatus is designed to regulate pressure in the event of two types of failure modes resulting in a pressure rise or spike:
1. Pressure spike when the unit is operational and has power
2. Pressure spike in the case of complete power loss Failure mode 1—in case of unit having power: In this scenario, normal operation continues until the pressure of the fluid is maintained at or below 90% of the user defined operating pressure limit. As the pressure of the fluid starts to approach the operating pressure limit (90%-93% of max value, aka cracking pressure), pressure regulated valve 6 starts to open partially. If the pressure continues to rise, valve 6 opens fully. The fluid is now diverted to the buffer volume and an additional flow path is opened for the fluid, which is 13a-14a-1-5-6-7-10-11-14b-13b. The buffer volume is an empty pressure vessel maintained at a low pressure. In comparison, the wafer conditioning circuit within the semiconductor chuck is a series of small conduits that the fluid flows through. As a result, the pressure drop or resistance to flow for the fluid is much lower through the buffer volume as compared to the conditioning circuit. The outlet of the buffer volume is connected to the return side of the conditioning circuit which is always at a lower pressure than the supply side. Overall, this arrangement causes more fluid to flow into the buffer volume than into the conditioning circuit. With the added volume available for the fluid to occupy, along with the mass flow being actively diverted to the buffer volume, the overall pressure in the fluid circuit in and around the conditioning circuit or chuck is reduced. If the rate of pressure drop is not enough as detected by pressure transducers 2, valve 3 is opened providing another flow path for the fluid to the buffer volume. If the event that originally caused the fluid pressure to rise is a onetime/transient event, the pressure in the fluid system will start to normalize towards the normal operating range. Once the pressure drops to ~93% of the max value, valve 6 closes along with valve 3, isolating the buffer volume from the fluid circuit. Fluid already present in the buffer volume is drained back into the fluid circuit automatically because the outlet of the buffer volume is connected to return side (low pressure side) of the fluid circuit.

If the event that caused the pressure spike is not transient/one time event and the pressure continues to rise, the supply valve on the fluid conditioning circuit 14a is closed to ensure that no new mass of fluid is introduced into this section of the fluid conditioning circuit. The return valve 14b on the circuit remains opens to drain as much fluid from the chuck and buffer volume as possible. After a specified time delay, if the event that led to pressure rise is still ON, the system compressor shuts off.

Failure mode 2—in case of complete power loss: If the chamber loses all power, it is understood that the flow of fluid in the conditioning circuit will stop (compressor powered OFF). As the stagnant fluid warms up, it will expand causing a rise in the fluid pressure. This pressure rise can be enough to damage the wafer conditioning circuit or in this embodiment chuck SC-1.

To protect against this failure mode, the following will take place: Valves 14a and 14b will close isolating the pressure regulating apparatus and the wafer conditioning circuit from the rest of the refrigeration system. Valve 3 (normally open type) will open. This provides the fluid a conduit to expand into the buffer volume. If the mass flow rate through Valve 3 is not enough and the pressure continues to rise, Valve 5 will open once the fluid pressure exceeds its rated reverse flow value (pilot operated valve). Valve 5 is selected such that it allows for reverse flow at a back-pressure value that is smaller than the setpoint value for valve 6.

Subsequently, valve 6 reacts to the pressure rise allowing for an additional flow passage into the buffer volume. This causes a drop in the pressure of the fluid circuit. To protect against this mode of failure, the buffer volume should be large enough to accommodate the overall volume increase of the fluid as it warms up from cryogenic to ambient temperature. This required volume can be accurately estimated based on the fluid properties, the overall internal volume of the fluid conditioning circuit and the internal volume of the chuck. When power is restored and chamber is operational again, Valve 3 closes and valve 5 opens. Valve 6 closes as the pressure drops to ~90% of the setpoint pressure valve. The fluid in the buffer volume is drained into the return side of the fluid conditioning circuit and normal operation of the unit can commence.

The check valves (items 1, 4, 10, 11) serve the purpose of ensuring that there is no back flow of the fluid into the buffer volume or into the supply side of the system in the event of an abnormal pressure differentials.

Figure 4:
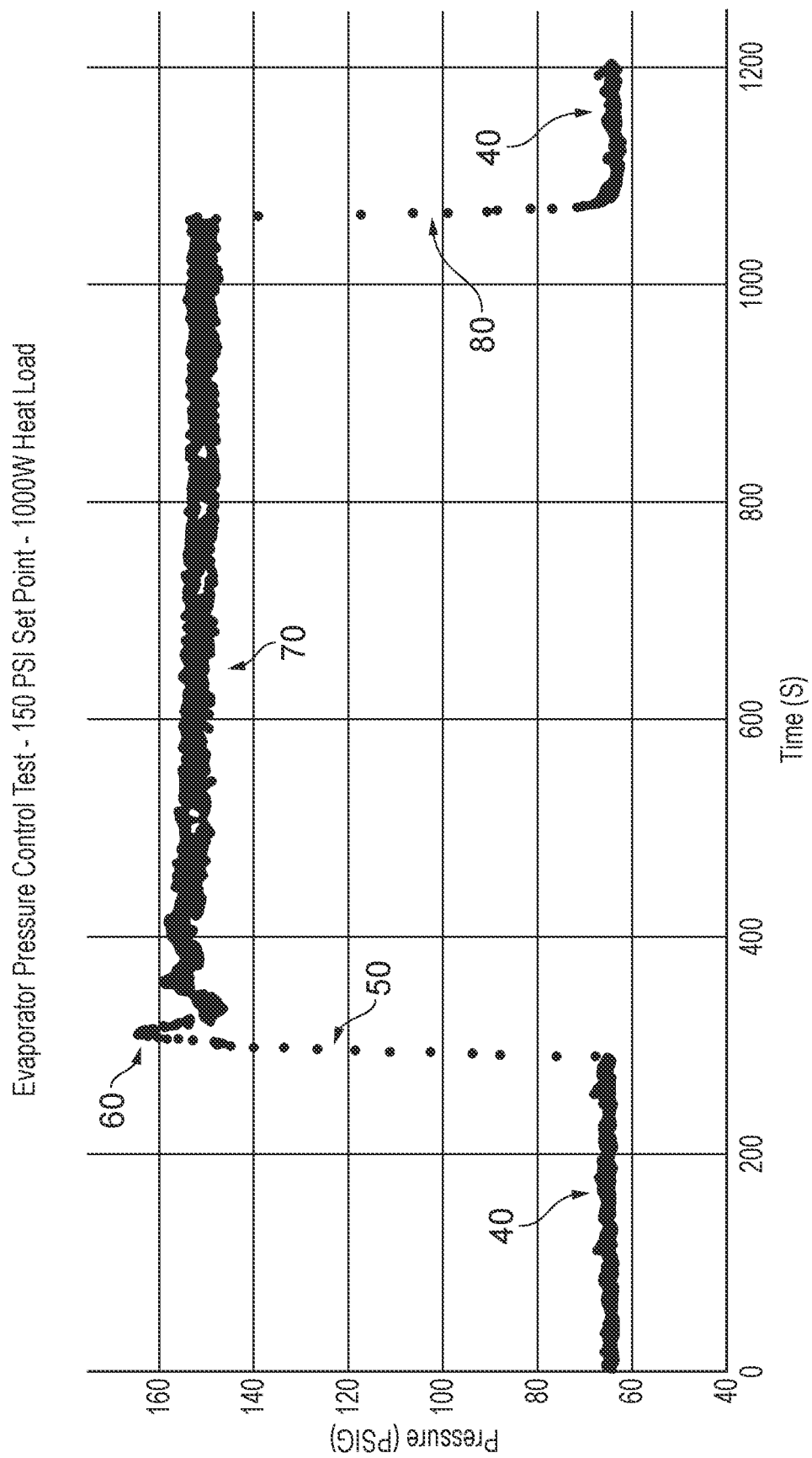
FIG. 4 shows mitigation of pressure rises by an apparatus according to an embodiment during operation.

FIG. 4 schematically shows how pressure changes within the system when the pressure regulating apparatus's protection mechanism is triggered in failure mode 1. In this example a pressure increase forcing input is applied to the system at 50 and when the pressure rises above a predetermined level 60 the pressure controlled valve opens, and pressure relief is provided to the system via access to the buffer volume and a bypass path provided via this buffer volume. The pressure relief is maintained at 70 by keeping this flow path open and once the forcing pressure is removed at 80 the pressure within the system falls and the pressure controlled valve closes, the buffer volume bypass path is once more isolated from the system and normal operation resumes at 40.

Figure 5:
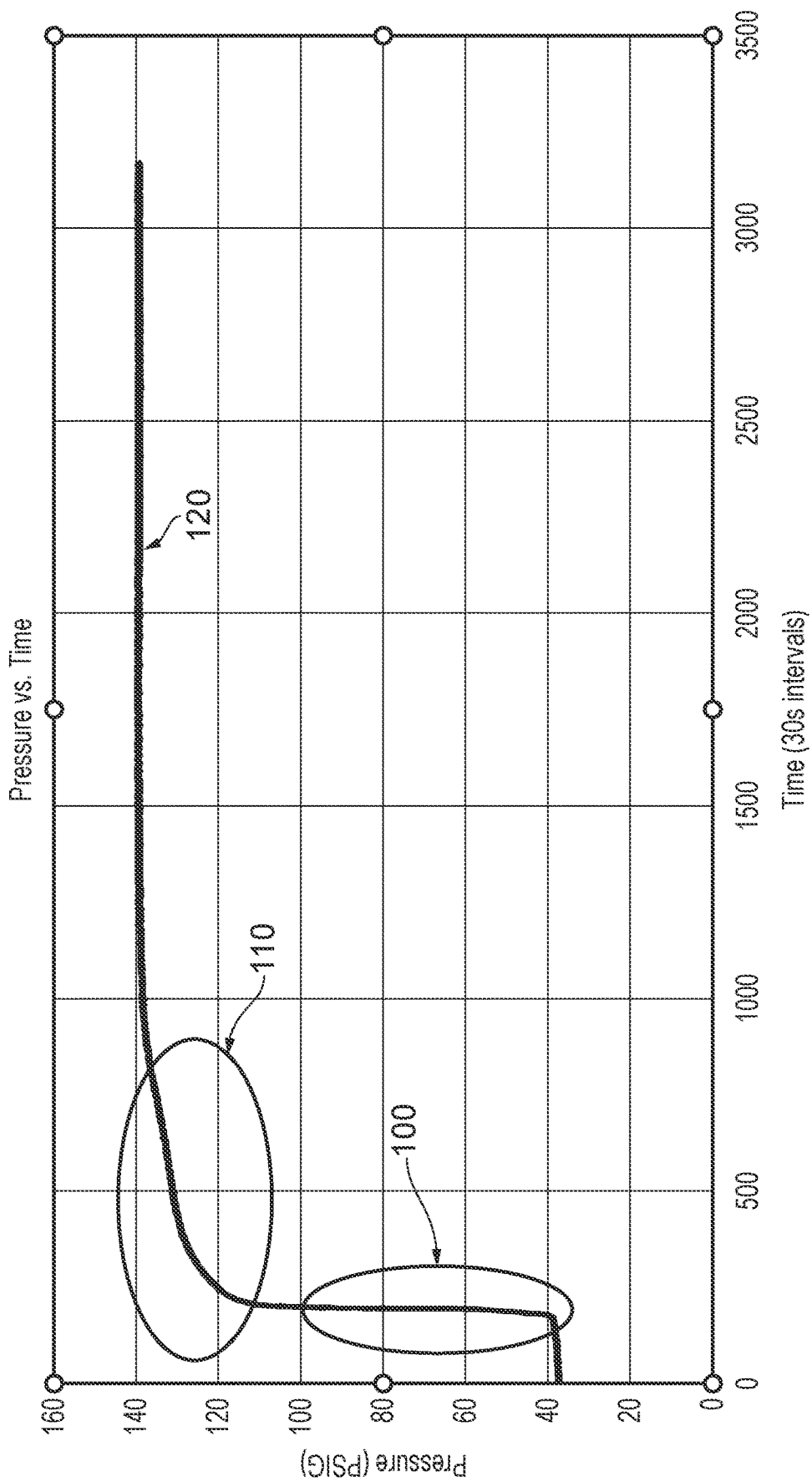
FIG. 5 shows mitigation of pressure rises by an apparatus according to an embodiment during power failure.

FIG. 5 shows how the system acts to protect from undue pressure rise in the event of a power failure, failure mode 2. Initially there is a steep increase in pressure 100 when power loss occurs. At 110 the pressure control mechanism kicks in, the buffer volume is connected to the conditioning circuit and the system inlet and outlet valves are closed. Owing to the size of the buffer vessel the pressure is maintained at a safe level 120.

Several embodiments are possible depending on the arrangement of the process chamber and processing steps (parallel wafer processing vs. sequential). As an example, in a chamber arrangement where more than one semiconductor chucks are used for device fabrication in parallel (each chuck running the same recipe on the wafer) and each being cooled in parallel by the same process chiller, the arrangement in FIG. 2 can be employed. In this embodiment, the principle of pressure regulation remains the same, however it is proposed that 2 or more valve sets are used in parallel to ensure enough mass flow rate for the fluid (and commensurate response time to reduce pressure) to accommodate for the internal volumes of multiple chucks.

In another embodiment FIG. 3, one set of valves that help regulate pressure inside the fluid conditioning circuit can be placed after (downstream) the semiconductor chuck. This arrangement also results in effective pressure regulation and can be implemented based on one or more of the following factors—pressure drop inside the chuck, physical arrangement/layout and piping of the chuck conditioning circuit and available room.

Several other embodiments of the concept are possible such as using two or more pressure regulating valves 6 in parallel to provide faster response times, greater mass flow etc. These choices will be dictated by specific requirements.

The pressure regulating valve 6 can function by itself without the need for valve 5. However, during pump maintenance when the buffer volume needs to be completely isolated or valve 6 needs to be replaced, valve 5 acts like a shut-off isolation valve.

In some embodiments, the pressure controlled or regulating valve 6 is a "cryogenic economizer". These valves are generally used on large cryogenic tanks (liquid N2, O2 etc.) to maintain static head pressure. Controlling the pressure in dynamic operating environment is a novel use of this kind of valve Valves 3 and 5 are actively controlled using a simple electronic controller. This can be the cryochiller's main controller or a secondary dedicated controller 30. The controller reads pressure values from the pressure transducers 2 in the assembly and relays a signal to the valve to OPEN or CLOSE.

The entire assembly may have pressure relief valves PRV set to appropriate venting pressures such as the one shown on the buffer vessel. There may be an exhaust line from the pressure relief valve to ensure that it vents outside of the clean room.

In some embodiments, where the pressure regulating apparatus is activated often in a short period of time, especially in a mode where the set-point temperature of the refrigerant mixture is low, a condition may arise where liquid refrigerant is accumulated in the buffer volume. While some accumulation is fine and expected, if excess refrigerant is accumulated it is preferable to have a means to evaporate the liquid and return the refrigerant back to the cooling system for stable operations. The heating can be electric heating or hot refrigerant can be introduced into the buffer volume 7 through line 27 by opening valve 5 (see FIG. 2, for example). This hot refrigerant mixes with the cold liquid in the buffer volume and causes it to evaporate. Valve 5 can be closed or heater turned off after a specified time delay or by sensing the temperature of the buffer vessel or pressure inside the buffer vessel etc.

In some embodiments this heating mechanism is activated either in response to detecting the frequent activation of the system or by a combination of controller logic and temperature sensor(s). Temperature sensors (thermocouples) may for example be mounted on the outside walls of the buffer vessel. If there are more than a specific number of pressure mitigation events in a given time (that can be specified) and if the tank's surface temperature stays below a specified value after said pressure mitigation events, a hot gas/electric heating event can be triggered.

Alternatively an electric heater may be provided on/in the tank and this is triggered for a specified time after every pressure mitigation event OR if the tank's surface temperature stays below a particular value for a given amount time irrespective of whether a pressure mitigation event occurred.

In summary the following functionality is provided by at least some embodiments:

1. Ability to control pressure in a semiconductor wafer's thermal conditioning circuit over a wide temperature range (cryogenic temperatures to ambient and above). In this regard where warming rather than cooling is required warmed refrigerant may be supplied to the conditioning circuit from the refrigeration system, either by passing it through a heat exchanger, or by diverting warmed refrigerant from a warmer part of the refrigeration system.
2. Ability to control pressure for direct refrigerant cooling as well as secondary fluid cooling type systems
3. Ability to control pressure dynamically (not just vent using a relief valve) thereby reducing the need for an emergency shut-off and subsequent maintenance and start up procedures when there is a pressure spike
4. Ability to have user settable setpoint for the pressure limit and use the same apparatus over a wide pressure control band (no need to physically change valves to change pressure setpoint)
5. Ability to provide high resolution for pressure control setpoint because of the use of multiple number and type of valves
6. Ability to ensure that process parameters are repeatable (because of dynamic control and fine setpoint resolution ability) which is paramount in semiconductor processing in general.

The use of a combination of mechanically actuated and power assisted (electric or pneumatic) valves provides a solution for most failure modes The pressure regulating apparatus of an embodiment can be added to an existing installation to enhance its operation envelope in terms of temperature, pressure and safety.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A pressure regulating apparatus for mitigating pressure increases in a semiconductor wafer conditioning circuit, said pressure regulating apparatus comprising:
   a buffer vessel, said buffer vessel comprising an inlet channel and an outlet channel; wherein
   said inlet channel is configured in operation to be in fluid communication with a higher pressure location of said semiconductor wafer conditioning circuit, and said outlet channel is configured in operation to be in fluid communication with a lower pressure location;
   said inlet channel comprising at least one pressure controlled valve configured to close said inlet channel during normal operation such that said buffer vessel is isolated from said higher pressure location of said conditioning circuit and to open said inlet channel in response to said pressure within said semiconductor conditioning circuit rising above a predetermined level.

2. The pressure regulating apparatus according to claim 1, further comprising a check valve in said outlet channel for inhibiting flow from said conditioning circuit to said buffer vessel via said outlet channel.

3. The pressure regulating apparatus according to claim 1, wherein said pressure controlled valve comprises a mechanical spring loaded valve.

4. The pressure regulating apparatus according to claim 1, said pressure regulating apparatus further comprising at least one pressure sensor for sensing a pressure and a system controller configured to generate control signals in response to signals received from said at least one pressure sensor.

5. The pressure regulating apparatus according to claim 4, wherein said at least one pressure controlled valve comprises a power actuated valve, said system controller being configured to generate a control signal to open said power actuated valve in response to said at least one pressure sensor indicating a predetermined pressure level has been reached.

6. The pressure regulating apparatus according to claim 5, wherein said pressure regulating apparatus is configurable such that said predetermined pressure at which said power actuated valve opens can be selected.

7. The pressure regulating apparatus according to claim 1, wherein said inlet channel further comprises a second valve, said second valve comprising a power actuated valve configured to be closed to isolate said pressure controlled valve and buffer vessel from said conditioning circuit when not powered and open when powered.

8. The pressure regulating apparatus according to claim 1, wherein said buffer vessel comprises at least one further inlet channel in fluid communication with a higher pressure location than a location said outlet channel is in fluid communication with, said at least one further inlet channel comprising a power actuated valve said power actuated valve being closed when powered and open when not powered.

9. The pressure regulating apparatus according to claim 8, said pressure regulating apparatus further comprising at least one pressure sensor for sensing a pressure and a system controller configured to generate control signals in response to signals received from said at least one pressure sensor and said system controller being configured to generate a control signal to open said power actuated valve in said at least one further inlet channel in response to said at least one pressure sensor indicating a predetermined pressure level has been reached.

10. The pressure regulating apparatus according to claim 8, said at least one further inlet channel further comprising a check valve for inhibiting flow from said conditioning circuit to said buffer vessel via said at least one further inlet channel.

11. The pressure regulating apparatus according to claim 1, wherein said pressure regulating apparatus comprises an inlet line for receiving a conditioning fluid from a refrigeration system and for supplying said conditioning fluid to said wafer conditioning circuit and a return line for receiving conditioning fluid from said wafer conditioning circuit and returning said conditioning fluid to said refrigeration system, said inlet channel being connected to said inlet line.

12. The pressure regulating apparatus according to claim 11, wherein said outlet channel is connected to said return line.

13. The pressure regulating apparatus according to claim 11, wherein said pressure regulating apparatus comprises a system inlet power actuated valve on said inlet line and a system outlet power actuated valve on said return line for isolating said pressure regulating apparatus and wafer conditioning circuit from said refrigeration system, said system inlet actuated valve and said system outlet power actuated valve being open when powered and closed when not powered.

14. The pressure regulating apparatus according to claim 13, said pressure regulating apparatus further comprising at least one pressure sensor for sensing a pressure of said conditioning fluid and a system controller configured to generate control signals in response to signals received from said at least one pressure sensor wherein said system controller is configured in response to said sensed pressure rising above a further predetermined level that is higher than said predetermined level to close said system inlet power actuated valve.

15. The pressure regulating apparatus according to claim 14, wherein said system controller is configured in response to said sensed pressure rising to a further higher predetermined level to close said system outlet power actuated valve.

16. The pressure regulating apparatus according to claim 14, wherein said system controller is configured after a predetermined time to close said system outlet power actuated valve.

17. The pressure regulating apparatus according to claim 13, wherein said system controller is configured in response to said sensed pressure falling to open said system inlet power actuated valve.

18. The pressure regulating apparatus according to claim 1, wherein said inlet channel carries a conditioning fluid comprising a 2-phase mixture of fluids.

19. The pressure regulating apparatus according to claim 1, wherein a size of said buffer vessel is sufficient to accommodate expansion of a conditioning fluid within said apparatus warming from a low temperature of operation to room temperature.

20. The pressure regulating apparatus according to claim 1, wherein said conditioning circuit comprises a plurality of conditioning circuits arranged in parallel for cooling a plurality of semiconductor wafers.

21. The pressure regulating apparatus according to claim 20, said pressure regulating apparatus further comprising at least one pressure sensor for sensing a pressure and control circuitry configured to generate control signals in response to signals received from said at least one pressure sensor wherein said at least one pressure sensor comprises a plurality of pressure sensors configured to sense pressure within said plurality of conditioning circuits.

22. The pressure regulating apparatus according to claim 4, wherein said pressure regulating apparatus comprising a heating mechanism for warming said buffer vessel, said control circuitry being configured to control said heating mechanism to warm said buffer vessel in response to at least one of:
  activation of said pressure controlled valve occurring more frequently than a predetermined frequency; and
  a temperature of said buffer vessel falling below a predetermined level and staying below said predetermined temperature for a predetermined time.

23. A semiconductor wafer cooling apparatus comprising a refrigeration system and the pressure regulating apparatus according to claim 1.

24. The semiconductor wafer cooling apparatus according to claim 23, wherein said pressure regulating apparatus receives a refrigerant of said refrigeration system.

25. A method of providing pressure protection to a semiconductor wafer conditioning circuit, said method comprising:

connecting an inlet channel and an outlet channel of a pressure regulating apparatus to the semiconductor wafer conditioning circuit such that the inlet channel of the pressure regulating apparatus is in fluid communication with an inlet line of the semiconductor wafer conditioning circuit and the outlet channel of the pressure regulating apparatus is in fluid communication with a return line of the semiconductor wafer conditioning circuit wherein the inlet line of the semiconductor wafer condition circuit is configured to receive conditioning fluid from a refrigeration system and the return line of the semiconductor wafer condition circuit is configured to return the conditioning fluid to the refrigeration system.

* * * * *